(12) United States Patent
Van Beek et al.

(10) Patent No.: US 7,847,649 B2
(45) Date of Patent: Dec. 7, 2010

(54) MEMS RESONATOR, A METHOD OF MANUFACTURING THEREOF, AND A MEMS OSCILLATOR

(75) Inventors: Jozef T. M. Van Beek, Rosmalen (NL); Hans-Peter Loebl, Monschau-Imgenbroich (DE); Frederik W. M. Vanhelmont, Genk (BE)

(73) Assignee: NXP B.V., Eindhoven (NL)

( * ) Notice: Subject to any disclaimer, the term of this patent is extended or adjusted under 35 U.S.C. 154(b) by 259 days.

(21) Appl. No.: 12/158,985

(22) PCT Filed: Dec. 18, 2006

(86) PCT No.: PCT/IB2006/054931

§ 371 (c)(1),
(2), (4) Date: Sep. 19, 2008

(87) PCT Pub. No.: WO2007/072409

PCT Pub. Date: Jun. 28, 2007

(65) Prior Publication Data

US 2009/0219104 A1 Sep. 3, 2009

(30) Foreign Application Priority Data

Dec. 23, 2005 (EP) .................................. 05112938

(51) Int. Cl.
*H03B 5/30* (2006.01)

(52) U.S. Cl. .................. 331/154; 331/116 M; 333/187; 29/25.35; 310/321

(58) Field of Classification Search .................. 331/154, 331/116 M; 310/321; 29/25.35; 333/187
See application file for complete search history.

(56) References Cited

U.S. PATENT DOCUMENTS

| 5,963,857 A | 10/1999 | Greywall |
| 6,958,566 B2 * | 10/2005 | Nguyen et al. .............. 310/321 |
| 2002/0069701 A1 | 6/2002 | Hsu et al. |
| 2005/0162239 A1 | 7/2005 | Lutz et al. |

FOREIGN PATENT DOCUMENTS

| EP | 1548935 A1 | 6/2005 |
| WO | 9829943 A1 | 7/1998 |
| WO | 2005025057 A2 | 3/2005 |

* cited by examiner

*Primary Examiner*—Arnold Kinkead

(57) ABSTRACT

The invention relates to a MEMS resonator comprising a movable element (48), the movable element (48) comprising a first part (A) having a first Young's modulus and a first temperature coefficient of the first Young's modulus, and the movable element (48) further comprising a second part (B) having a second Young's modulus and a second temperature coefficient of the second. Young's modulus, a sign of the second temperature coefficient being opposite to a sign of the first temperature coefficient, at least, at operating conditions of the MEMS resonator, and a cross-sectional area of the first part (A) and the cross-sectional area of the second part (B) being such that the absolute temperature coefficient of the Young's modulus of the first part (A) multiplied by the cross-sectional area of the first part (A) does not deviate more than 20% from the absolute temperature coefficient of the Young's modulus of the second part (B) multiplied by the cross-sectional area of the second part (B), the cross-sectional areas being measured locally and perpendicularly to the movable element (48).

8 Claims, 3 Drawing Sheets

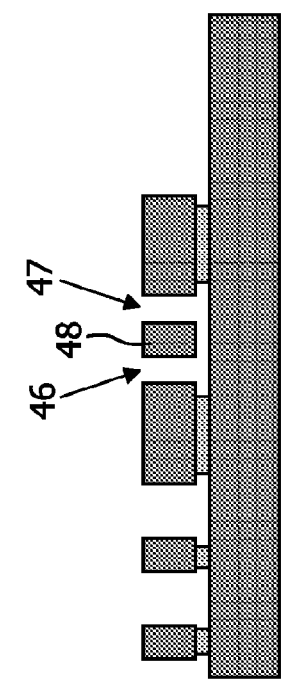
FIG. 1a
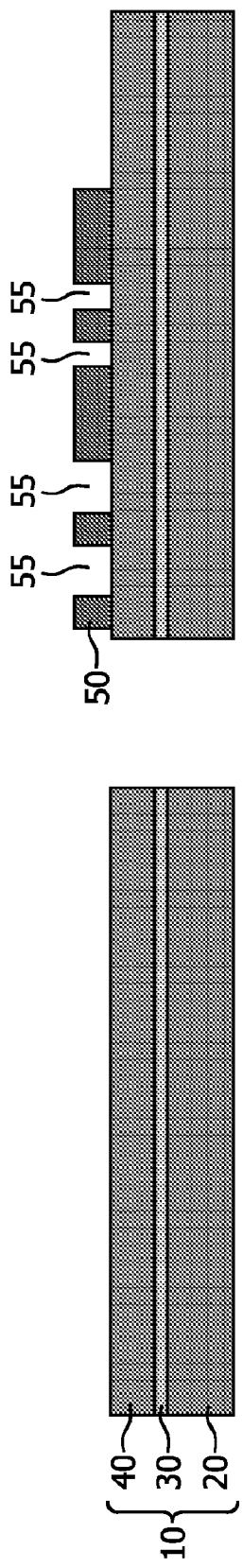
FIG. 1b
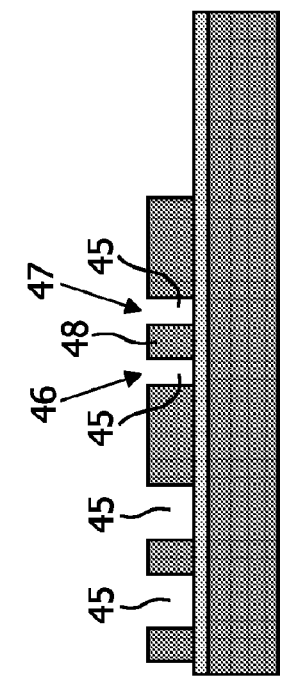
FIG. 1c
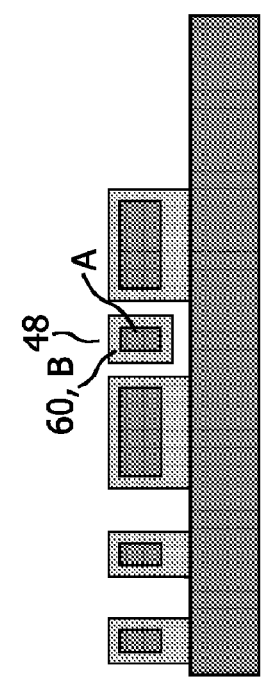
FIG. 1d
FIG. 1e

MEMS RESONATOR, A METHOD OF MANUFACTURING THEREOF, AND A MEMS OSCILLATOR

The invention relates to a MEMS resonator having a temperature-compensating feature. The invention also relates to a method of manufacturing such a MEMS resonator. The invention further relates to a MEMS oscillator comprising a MEMS resonator, and to an integrated circuit comprising such a MEMS oscillator.

A MEMS resonator is known from U.S. 2005/0162239. This document discloses a MEMS resonator comprising a beam, which comprises a plurality of materials (e.g. silicon and silicon oxide) that have different thermal expansion coefficients. The beam is supported over a substrate by two anchors, one at each end of the beam, the substrate having a different thermal expansion coefficient than the beam. Because of the anchors, which act as fixation points, the difference in thermal expansion coefficient between the substrate and the beam induces a tensile or compressive strain in the beam. A compressive strain tends to decrease the resonance frequency of a beam and a tensile strain tends to increase the resonance frequency. Thus, with these measures a thermal compensation effect in the resonance frequency can be achieved in the known MEMS resonator.

A drawback of the known MEMS resonator is that its structure is relatively complex. The thermal compensation of the resonance frequency requires fixation points at both ends of the beam.

It is an object of the invention to provide an alternative MEMS resonator of the kind set forth in the opening paragraph, which is less complex and which provides a better thermal compensation effect of the resonance frequency. The invention is defined by the independent claims. The dependent claims define advantageous embodiments.

The object is achieved in that the invention provides a MEMS resonator comprising a movable element, the movable element comprising a first part having a first Young's modulus and a first temperature coefficient of the first Young's modulus, and the movable element further comprising a second part having a second Young's modulus and a second temperature coefficient of the second Young's modulus, a sign of the second temperature coefficient being opposite to a sign of the first temperature coefficient, at least, at operating conditions of the MEMS resonator, and a cross-sectional area of the first part and the cross-sectional area of the second part being such that the absolute temperature coefficient of the Young's modulus of the first part multiplied by the cross-sectional area of the first part does not deviate more than 20% from the absolute temperature coefficient of the Young's modulus of the second part multiplied by the cross-sectional area of the second part, the cross-sectional areas being measured locally and perpendicularly to the movable element.

The movable elements of MEMS resonators commonly comprise material having a negative temperature coefficient of its Young's modulus. For example, the temperature coefficient of the Young's modulus for silicon is typically −88 ppm/K. As a result of this, the resonance frequency of silicon-based resonators may drift as much as −45 ppm/K, which is typically too large for application in, e.g., reference oscillators. The invention aims at providing the movable element with a second material having an opposite (here positive) temperature coefficient of its Young's modulus. In this way the effective absolute temperature coefficient of the Young's modulus of the movable element can be reduced, which results in a MEMS resonator with a much lower temperature drift of the resonance frequency.

In other words, no compressive or tensile strain in the movable element is required in the MEMS resonator according to the invention, which gives a designer of the MEMS resonator much more freedom to decide where and how to implement anchors of the movable element. For example, in the MEMS resonator according to the invention, the anchors of the movable element may be implemented in the center of the MEMS resonator, which is very attractive for longitudinal-mode resonators. Also the term "bulk-mode resonator" is used for such a MEMS resonator.

The invention further relies upon the insight that the Young's modulus is a far more attractive quantity to use for temperature compensation than the thermal expansion. For example, the difference in Young's modulus for silicon and silicon oxide is more than 200 ppm/K. The difference in thermal expansion is only between 2 ppm/K and 3 ppm/K. In other words, the thermal compensation mechanism in the MEMS resonator according to the invention is far more effective.

In the MEMS resonator according to the invention it is possible to realize any effective temperature coefficient that is between the temperature coefficient of the Young's modulus of the first part of the movable element and the temperature coefficient of the Young's modulus of the second part of the movable element. In practice, an effective temperature coefficient close to zero is the most advantageous. Factors influencing the accuracy of tuning this coefficient to zero are the accuracy of the initial cross-sectional area of the first part of the movable element and the cross-sectional area of the second part of the movable element.

Another insight of the inventor is that the cross-sectional areas of the first part and the second part of the movable element are design parameters which allow for tuning the absolute effective temperature coefficient of the Young's modules of the movable element to an acceptable level, and even to a value close to zero.

An advantageous embodiment of the MEMS resonator according to the invention is characterized in that a ratio of the cross-sectional area of the first part of the movable element divided by the cross-sectional area of the second part of the movable element approximately equals a further ratio of the negative temperature coefficient of the Young's modulus of the second part of the movable element divided by the temperature coefficient of the Young's modulus of the first part of the movable element. The advantage of such a MEMS resonator is that the absolute effective temperature coefficient is optimally reduced.

In another embodiment of the MEMS resonator according to the invention, the first part or the second part comprises silicon and the other part comprises silicon oxide. The Young's modulus of silicon oxide is known to have a temperature drift of +175 ppm/K. By combining silicon oxide with silicon as structural materials in the movable element of the MEMS resonator, it is possible to compensate for temperature drift. Furthermore, silicon oxide is a material which is very compatible with standard processes and therefore easy to produce.

In some embodiments of the MEMS resonator according to the invention, the second part embeds the first part in at least one direction perpendicular to the moving element. This symmetry improves the resonating behavior of the movable element.

In another embodiment of the MEMS resonator according to the invention, the second part completely surrounds the first part in a plane perpendicular to the moving element. In an alternative embodiment of the MEMS resonator according to the invention, the first part completely surrounds the second part in a plane perpendicular to the moving element. In both embodiments, the resonating behavior is further improved, because vibrations in the plane perpendicular to the movable element now experience the same effective Young's modulus and temperature coefficient (elasticity).

The invention also relates to a method of manufacturing a MEMS resonator. The method according to the invention comprises the following steps:

providing a semiconductor body comprising a substrate layer, a sacrificial layer provided on the substrate layer, and a top layer provided on the sacrificial layer, the top layer comprising a first material for forming a first part of the movable element, the first part having a first Young's modulus and a first temperature coefficient of the first Young's modulus;

patterning the top layer for defining a movable element;

selectively removing the sacrificial layer for partially releasing the movable element from the substrate layer;

providing a second material onto the movable element for forming a second part of the movable element, the second part having a second Young's modulus and a second temperature coefficient of the second Young's modulus, the sign of the second temperature coefficient being opposite to the sign of the first temperature coefficient, at least, at operating conditions of the MEMS resonator, the cross-sectional area of the first part and the cross-sectional area of the second part being such that the absolute temperature coefficient of the Young's modulus of the first part multiplied by the cross-sectional area of the first part does not deviate more than 20% from the absolute temperature coefficient of the Young's modulus of the second part (B) multiplied by the cross-sectional area of the second part, the cross-sectional areas being measured locally and perpendicularly to the movable element.

The method of manufacturing the MEMS resonator according to the invention provides a convenient way of creating the movable element having a first part and a second part having different temperature coefficients of the Young's modulus. Please note that the order of the steps in the method according to the invention can be changed. For example, the second material can be provided onto the movable element before selective removal of the sacrificial layer. Conventional steps like etching, deposition, CMP may be used for this purpose.

An advantageous embodiment of the method according to the invention is characterized in that in the step of providing a semiconductor body, a top layer is provided on the sacrificial layer, which comprises silicon. Silicon is a material which is compatible with standard processes and therefore allows easy integration with other devices and circuits.

In an improvement of the method according to the last-mentioned embodiment of the invention, the step of providing the second material comprises an oxidation step, wherein at least the silicon of at least one sidewall of the movable element is converted into silicon oxide. Oxidation (e.g. thermal oxidation) enables a very accurate control of the resulting silicon oxide thickness. Thus, the effective thermal coefficient of the Young's modulus can be easily tuned to zero through the oxidation of silicon forming a layer of silicon oxide of appropriate thickness. During thermal oxidation, silicon of the movable element is consumed; thus, the volume of the first part of the movable element comprising silicon decreases, while the volume of the second part of the movable element increases.

The invention further relates to a MEMS oscillator comprising a MEMS resonator. The advantage of the MEMS resonator according to the invention is that it comprises a passive compensation technique. Therefore, the MEMS resonator and MEMS oscillator do not need any feedback or control circuitry and are less complex. In active temperature compensation techniques, the temperature is measured and a signal is fed back to a control circuit, which makes the MEMS resonator and MEMS oscillator more complex.

The invention further relates to an integrated circuit comprising such a MEMS oscillator. The formation of a silicon oxide layer over a silicon resonator is compatible with the processing flow of integrated circuits. The MEMS resonator according to the invention therefore allows relatively straight-forward integration of a monolithic integrated MEMS oscillator.

The additional features can be combined with each other and with any of the aspects. Other advantages will be apparent to those skilled in the art. Numerous variations and modifications can be made without departing from the claims of the present invention. Therefore, it should be clearly understood that the present description is illustrative only and not intended to limit the scope of the present invention.

How the present invention may be put into effect will now be described by way of example with reference to the appended drawings, in which:

FIG. 1a to FIG. 1e illustrate a method of manufacturing a MEMS resonator according to one embodiment of the method according to the invention;

Figure 2:
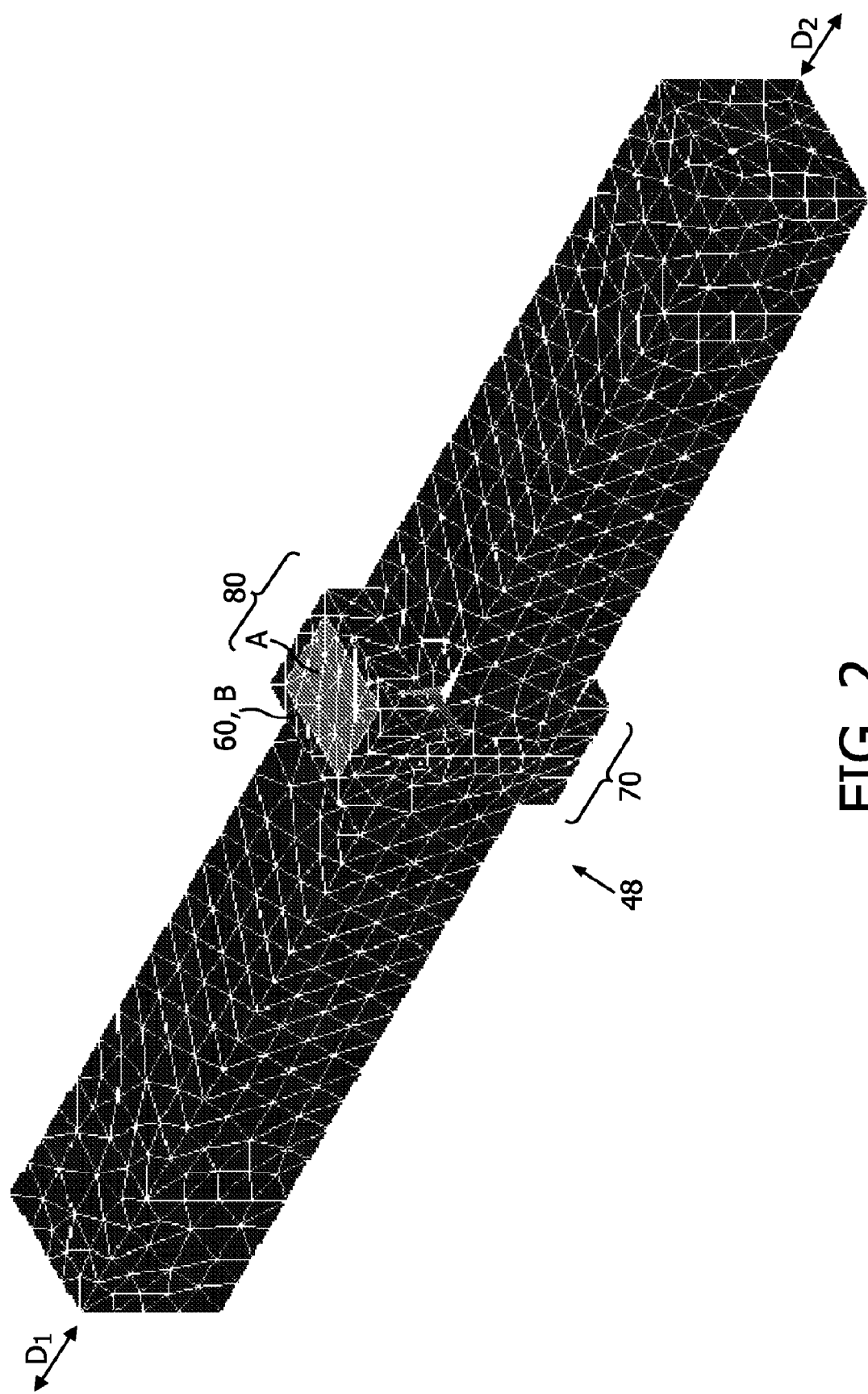
FIG. 2 illustrates a movable element of a MEMS resonator according to one embodiment of the invention.

The present invention will be described with respect to particular embodiments and with reference to certain drawings, but this is not to be construed in a limiting sense, as the invention is limited only by the appended claims. Any reference signs in the claims shall not be construed as limiting the scope thereof The drawings described are only schematic and are non-limiting. In the drawings, the size of some of the elements may be exaggerated and not drawn to scale for illustrative purposes. Where the term "comprising" is used in the present description and claims, it does not exclude other elements or steps. Where an indefinite or definite article is used when referring to a singular noun, e.g. "a" or "an", "the", this includes a plural of that noun unless specifically stated otherwise.

Furthermore, the terms first, second, third and the like in the description and in the claims are used for distinguishing between similar elements and not necessarily for describing a sequential or chronological order. It is to be understood that the terms so used are interchangeable under appropriate circumstances, and that the embodiments of the invention described herein are capable of operation in other sequences than described or illustrated herein.

The Young's modulus is a material property that describes its stiffness and is therefore one of the most important material properties of the movable element of a MEMS resonator. The Young's modulus and the mass density are the two material properties determining the resonance frequency of a resonator. The Young's modulus of a material is given by the following formula:

$$E(T) = E_0 + \alpha \cdot \Delta T$$

wherein $E_0$ is the Young's modulus at operating conditions of the MEMS resonator, $\alpha$ is the temperature coefficient and $\Delta T$ is the temperature variation.

FIG. 1a to FIG. 1e illustrate a MEMS resonator in various stages of its manufacturing process according to one embodiment of the method according to the invention.

FIG. 1a refers to one stage of the manufacturing process, in which a semiconductor body 10 is provided. The semiconductor body 10 comprises a substrate layer 20, a sacrificial layer 30 provided on the substrate layer 20, and a top layer 40 provided on the sacrificial layer 30. The top layer 40 may comprise silicon in one embodiment of the invention, but other materials are also possible, like, for instance, germanium (Ge), III-V semiconductor compounds like gallium-arsenide (GaAs), II-VI semiconductor compounds like indium-phosphide (InP), and other materials. For the sacrificial layer 30, materials like silicon dioxide ($SiO_2$) may be used, but other materials are also possible. In case silicon is used as the material for the top layer 40 and silicon oxide (or another insulating material) as the material for the sacrificial layer 30, also the term silicon-on-insulator (SOI) is used. Silicon-on-insulator substrates/wafers are widely available in the market and can be manufactured in a cheap and easy way. In the example illustrated in FIG. 1a to FIG. 1e, a SOI substrate 10 is used, in which the top layer 40 comprises silicon, and in which the insulating (sacrificial) layer 30 comprises silicon dioxide.

FIG. 1b and FIG. 1c illustrate other stages of the manufacturing process. In FIG. 1b, a patterned mask layer 50 is provided having openings 55 therein. The mask layer 50 can be patterned by using, for example, conventional optical lithographic techniques, but also other techniques may be used like electron-beam lithography, ion-beam lithography and x-ray lithography. In these techniques, patterns are written directly onto the mask layer 50. In this particular example, photolithography is used. The mask layer 50 may then comprise a photoresist layer, but could alternatively be a hard mask, e.g., made of silicon oxide or silicon nitride. In FIG. 1c, the top layer 40 is patterned through the openings 55 in the mask layer 50. Hereby, openings 45 are formed in the top layer 40 which correspond with the openings 55 in the mask layer. This can be done by using, for example, a dry etching step (e.g. DRIE etching). Etching techniques are known by the person skilled in the art. The openings 45 are formed such that they expose sacrificial layer 30 underneath the top layer 40. Also gaps 46, 47 are formed, which define a movable element 48 of the MEMS resonator to be manufactured.

In FIG. 1d, showing another stage of the manufacturing process, the sacrificial layer 30 is locally removed (at least under the movable element) for partially releasing the movable element 48. This may be done by using, for example, a selective wet etching step. Selective etching techniques are also known by the person skilled in the art. The movable element is provided with clamped regions (not shown in the Figure). In this particular example, the movable element 48 is (at least) movable in a direction perpendicular to the sidewalls of the gaps 46, 47. However, other types of MEMS resonators exist also, such as longitudinal mode resonators.

The movable elements of MEMS resonators commonly comprise material having a negative temperature coefficient of its Young's modulus. For example, the temperature coefficient of the Young's modulus for silicon is typically −88 ppm/K. As a result of this, the resonance frequency of silicon-based resonators may drift as much as −45 ppm/K, which is typically too large for application in, e.g., reference oscillators.

FIG. 1e illustrates another stage of the manufacturing process of the MEMS resonator according to one embodiment of the method according to the invention. In this embodiment, the movable element 48 is provided with a layer of silicon oxide 60. While doing so, a first part A of the movable element 48 (comprising silicon) having a negative temperature coefficient of its Young's modulus is formed and a second part B of the movable element 48 (comprising silicon oxide) having a positive temperature coefficient of its Young's modulus is formed. The cross-sectional area of first part A and second part B are parameters which the skilled person may use to tune the absolute effective temperature coefficient of the movable element to a low value or even zero. In the example shown in FIG. 1e, it is a matter of forming the layer of silicon oxide 60 to a certain thickness for achieving a proper temperature compensation (small or zero temperature coefficient of the Young's modulus).

The formation of silicon oxide may be done by various methods, one of them being thermal oxidation. Thermal oxidation is a process well-known by the person skilled in the art. In the case of thermal oxidation of silicon, as is the case in the illustrated example, the oxidation is generally done at a temperature around 1000° C. in an environment comprising $O_2$ or $H_2O$ Oxidation (e.g. thermal oxidation) enables a very accurate control of the resulting silicon oxide thickness. Thus, the effective thermal coefficient of the Young's modulus of the movable element 48 may be easily tuned to zero through the oxidation of silicon forming a layer of silicon oxide 60 of appropriate thickness. During thermal oxidation, silicon of the movable element 48 is consumed; thus, the volume of the first part A of the movable element comprising silicon decreases, while the volume of the second part B of the movable element 48 increases. More information on thermal oxidation can be found in S. Wolf, "*Silicon Processing*", Vol. 1, pp. 198-241.

In FIG. 1e, silicon dioxide $SiO_2$ (the dielectric) is grown in all places where silicon is not covered and, in particular, on the movable element 48. However, the growth of silicon dioxide may be prevented in specific places by locally providing capping layers or by providing protective layers. Alternatively, different materials may be used in the top layer 40 in addition to silicon, so that only the silicon is oxidized. A well-known isolation technique using this principle is called LOCOS (Local Oxidation Of Silicon). In LOCOS, a silicon nitride ($Si_3N_4$) layer is used to avoid oxidation. Thus, this technique enables providing the dielectric on only specific parts of the movable element.

Alternatively, instead of oxidation, the dielectric (e.g. silicon oxide) may be deposited on the movable element 48. Several techniques exist for deposition, like atomic layer deposition (ALD) and low-pressure chemical vapor deposition (LPCVD). In order to make sure that the dielectric is deposited on sidewalls of the movable element 48, tilted/shadow deposition techniques may be used. More information on shadow deposition techniques can be found in S. Wolf, "*Silicon Processing*", Vol. 1, pp. 374.

Currently, silicon and silicon oxide seem to be the most compatible with standard processes. However, the skilled person may choose other materials having temperature coefficients with opposite signs. Such a variation does not depart from the scope of the invention. Also, in the case of deposition, there are fewer restrictions with respect to the choice of materials for the first part A and the second part B of the movable element 48.

Before or after the stage illustrated in FIG. 1e, various other steps may be carried out to complete the product, such as:
- partial removal of grown/deposited oxides;
- formation of electrodes;
- formation of bond pads;
- formation of additional circuitry;
- etc.

The above-mentioned steps are well known to the person skilled in the art.

Figure 3:
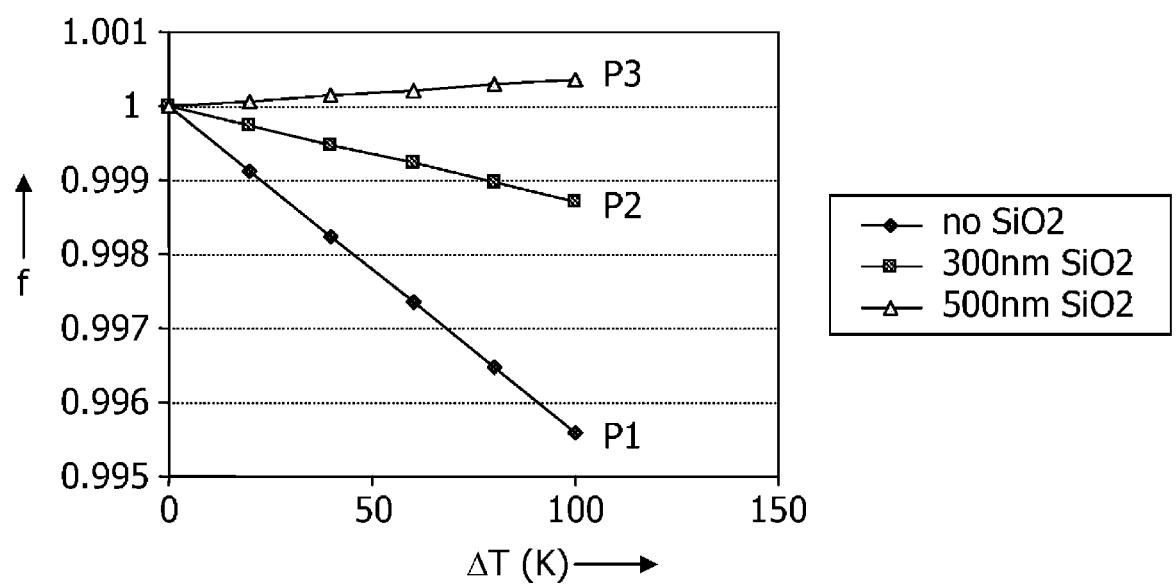
FIG. 3 shows a graph which demonstrates the validness of the invention.

Referring to FIG. 2 en FIG. 3, simulations have been performed to validate the invention. FIG. 2 shows the model used for these simulations, FIG. 3 shows the results. FIG. 2 shows the movable element 48 of a longitudinal mode MEMS resonator having a layer of silicon oxide 60 (forming part B of the movable element 48) at its surface. The first part (inner part) A of the movable element 48 comprises silicon in this example. Longitudinal mode MEMS resonators are resonators in which the movable element 48 moves in the longitudinal direction (to and from electrodes, not shown in the Figure). Thus, the length of the movable element 48 varies over time. These movements are indicated by two arrows D1, D2 in FIG. 2. The movable element 48 has been fixed by two anchors 70, 80 located in the middle.

The thickness of the silicon oxide layer 60 was used as a parameter for the simulations. As an example, the temperature drift of the resonance frequency of the longitudinal mode MEMS resonator is simulated in three different situations.

1) no silicon oxide (graph P1 in FIG. 3);

2) 300 nm of silicon oxide (graph P2 in FIG. 3); and 3) 500 nm of silicon oxide (graph P3 in FIG. 3).

In FIG. 3, the normalized resonance frequency of the MEMS resonator is plotted for the three different situations. From FIG. 3 it can be deduced that the temperature drift is reduced from −44 ppm/K (graph P1) to −13 ppm/K (graph P2) when 300 nm of silicon oxide is provided. Even a positive temperature drift of +3.5 ppm/K (graph P3) is obtained by further increasing the silicon oxide thickness to 500 nm. Thus, this means that a positive effective temperature coefficient of the Young's modulus has been achieved. From FIG. 3 it can be concluded that, for this particular example, a silicon oxide thickness in the range between 300 nm and 500 nm enables proper temperature compensation to be achieved (temperature coefficient equal to zero). These results demonstrate the validness of the invention.

Obviously, the thickness at locations where such temperature compensation occurs depends on various design parameters (length, thickness, width, material, etc). However, just a few experiments may suffice for the skilled person to find the proper oxide thickness.

The minimization of the temperature coefficient may be achieved as follows. The Young's modulus for first part A and second part B is given by:

$$E(T)_{A,B} = E_{0_{A,B}} + \alpha_{A,B} \cdot \Delta T$$

In the case of a movable element comprising two parts A,B, the effective temperature coefficient of the movable element is given by:

$$\alpha_{eff} = \frac{A_A \cdot \alpha_A + A_B \cdot \alpha_B}{A} = \frac{A_A \cdot \alpha_A + A_B \cdot \alpha_B}{A_A + A_B}$$

wherein $A_A$ is the cross-sectional area of the first part A, and $A_B$ is the cross-sectional area of the second part B, and wherein $\alpha_A$ is the temperature coefficient of the Young's modulus of the first part of the movable element, and $\alpha_B$ is the temperature coefficient of the Young's modulus of the second part of the movable element.

In the MEMS resonator according to the invention, it is possible to realize any effective temperature coefficient that is between the temperature coefficient of the Young's modulus of the first part of the movable element and the temperature coefficient of the Young's modulus of the second part of the movable element. In practice, an effective temperature coefficient close to zero is the most advantageous. Factors influencing the accuracy of tuning this coefficient to zero are the accuracy of the initial cross-sectional area of the first part of the movable element and the cross-sectional area of the second part of the movable element.

The effective temperature coefficient equals zero (and thus has been minimized) when the following condition is met:

$$A_A \cdot \alpha_A + A_B \cdot \alpha_B = 0$$

The ratio of the cross-sectional areas should meet the following requirement:

$$A_A \cdot \alpha_A = -A_B \cdot \alpha_B$$
$$\Rightarrow \frac{A_A}{A_B} = -\frac{\alpha_B}{\alpha_A}$$

Once the required ratio of the cross-sectional areas is known, the required oxide layer thickness can be easily calculated.

In a variation of the invention, the MEMS resonator is provided with a movable element having a third part having a third Young's modulus with a third temperature coefficient. In such a MEMS resonator at least the temperature coefficient of the Young's modulus of one of the first, second or third part must have an opposite sign to the temperature coefficients of the other parts. The equation for the effective temperature coefficient then reads:

$$\alpha_{eff} = \frac{A_A \cdot \alpha_A + A_B \cdot \alpha_B + A_C \cdot \alpha_C}{A} = \frac{A_A \cdot \alpha_A + A_B \cdot \alpha_B + A_C \cdot \alpha_C}{A_A + A_B + A_C}$$

wherein $A_C$ is the cross-sectional area of the third part, and $\alpha_C$ is the temperature coefficient of the Young's modulus of the third part of the movable element.

And the effective temperature coefficient equals zero if the following condition is met:

$$A_A \cdot \alpha_A + A_B \cdot \alpha_B + A_C \cdot \alpha_C = 0$$

The invention thus provides an attractive MEMS resonator, which has a better temperature compensation of the resonance frequency, and which is less complex than the MEMS resonators known in the prior art. The invention also provides a method of manufacturing the MEMS resonator.

The invention claimed is:

1. A MEMS resonator comprising a movable element, the movable element comprising a first part having a first Young's modulus and a first temperature coefficient of the first Young's modulus, and the movable element further comprising a second part having a second Young's modulus and a second temperature coefficient of the second Young's modulus, a sign of the second temperature coefficient being opposite to a sign of the first temperature coefficient, at least, at operating conditions of the MEMS resonator, and a cross-sectional area of the first part and the cross-sectional area of the second part being such that the absolute temperature coefficient of the Young's modulus of the first part multiplied by the cross-sectional area of the first part does not deviate more than 20% from the absolute temperature coefficient of the Young's modulus of the second part multiplied by the cross-sectional area of the second part, the cross-sectional areas being measured locally and perpendicularly to the movable element.

2. A MEMS resonator as claimed in claim 1, characterized in that a ratio of the cross-sectional area of the first part of the movable element divided by the cross-sectional area of the second part of the movable element approximately equals a further ratio of the negative temperature coefficient of the Young's modulus of the second part of the movable element divided by the temperature coefficient of the Young's modulus of the first part of the movable element.

3. A MEMS resonator according to claim 1, characterized in that the first part or the second part comprises silicon and the other part comprises silicon oxide.

4. A method of manufacturing a MEMS resonator comprising the following steps:
   providing a semiconductor body comprising a substrate layer, a sacrificial layer provided on the substrate layer, and a top layer provided on the sacrificial layer, the top layer comprising a first material for forming a first part of the movable element, the first part having a first Young's modulus and a first temperature coefficient of the first Young's modulus;
   patterning the top layer for defining a movable element;
   selectively removing the sacrificial layer for partially releasing the movable elementary from the substrate layer;
   providing a second material onto the movable element for forming a second part of the movable element, the second part having a second Young's modulus and a second temperature coefficient of the second Young's modulus, the sign of the second temperature coefficient being opposite to the sign of the first temperature coefficient, at least, at operating conditions of the MEMS resonator, the cross-sectional area of the first part and the cross-sectional area of the second part being such that the absolute temperature coefficient of the Young's modulus of the first part multiplied by the cross-sectional area of the first part does not deviate more than 20% from the absolute temperature coefficient of the Young's modulus of the second part multiplied by the cross-sectional area of the second part, the cross-sectional areas being measured locally and perpendicularly to the movable element.

5. A method as claimed in claim 4, characterized in that in the step of providing a semiconductor body, a top layer is provided on the sacrificial layer, which comprises silicon.

6. A method as claimed in claim 5, characterized in that the step of providing the second material comprises an oxidation step, wherein at least the silicon of at least one sidewall of the movable element is converted into silicon oxide.

7. A MEMS oscillator comprising the MEMS resonator as claimed in claim 1.

8. An integrated circuit comprising the MEMS oscillator as claimed in claim 7.

* * * * *